United States Patent [19]

Cushing et al.

[11] Patent Number: 4,933,909
[45] Date of Patent: Jun. 12, 1990

[54] DUAL READ/WRITE REGISTER FILE MEMORY

[75] Inventors: David E. Cushing, Chelmsford, Mass.; Romeo Kharileh, Nashua, N.H.; Jian-Kuo Shen, Belmont; Ming-Tzer Miu, Chelmsford, both of Mass.

[73] Assignee: Bull HN Information Systems Inc., Billerica, Mass.

[21] Appl. No.: 286,552

[22] Filed: Dec. 19, 1988

[51] Int. Cl.[5] .............................................. G11C 7/00
[52] U.S. Cl. ......................... 365/230.05; 365/189.04; 365/230.02
[58] Field of Search ...................... 365/230.04, 230.05, 365/230.08, 233, 230.02, 189.04, 189.02

[56] References Cited

U.S. PATENT DOCUMENTS 4,287,575  9/1981  Eardley et al. ................. 365/230.05
4,610,004  9/1986  Moller et al. ........................ 365/230
4,623,990  11/1986  Allen et al. .......................... 365/189

OTHER PUBLICATIONS

Wafer Scale Interconnections for GaAs Packaging-Applications to RISC Architecture, by J. F. McDonald, et al., Computer published by IEEE, 4/87, pp. 21-35.
Toward a GaAs Realization of a Production-System Machine, by T. F. Lehr, et al., Computer published by IEEE, 4/87, pp. 36-46.
Publication No. 08786, Rev. B, Amendment O, Issue Date 8/87, AM29C334 by Advanced Micro Devices, pp. 1-19.

Primary Examiner—Joseph A. Popek
Attorney, Agent, or Firm—Faith F. Driscoll; John S. Solakian

[57] ABSTRACT

A dual port read/write register file memory includes means for performing a read/modify write cycle of operation within a single system cycle of operation. The register file memory is constructed from one to more (RAM) addressable multibit storage arrays organized to form a dual read port, single write port RAM. Additionally, the register file includes a plurality of clocked input registers arranged in pairs for storing command, address and data signals for two write ports. The different pairs of registers are connected as inputs to a first set of multiplexer circuits whose outputs connect to the write control signal, address and data inputs of the single write port. The single write port of the register file memory is enabled for writing twice during each cycle. This allows data clocked into the input registers during the previous cycle to be written sequentially into the register file storage locations. By writing data into the input registers instead of the register file memory in a previous cycle, the time required for writing is reduced to a minimum.

22 Claims, 4 Drawing Sheets

DUAL READ/WRITE REGISTER FILE MEMORY

RELATED PATENT APPLICATIONS

1. The patent application of Ming-Tzer Miu and Thomas F. Joyce entitled, "Production Line Method and Apparatus for High Performance Instruction Execution," filed on even date herewith, bearing Ser. No. 07/286,580, which is assigned to the same assignee as this patent application.
2. The patent application of David E. Cushing, Richard P. Kelly, Robert V. Ledoux and Jian-Kuo Shen entitled, "A Mechanism for Automatically Updating Multiple Unit Register File Memories," filed on even date herewith, bearing Ser. No. 07/286,551, which is assigned to the same assignee as this patent application.
3. The patent application of Jian-Kuo Shen, Richard P. Kelly, Robert V. Ledoux and Deborah K. Staplin entitled, "Control Store Addressing from Multiple Sources," filed on even date herewith, bearing Ser. No. 07/286,578, which is assigned to the same assignee as this patent application.
4. The patent application of Richard P. Kelly, Jian-Kuo Shen, Robert V. Ledoux and Chester M. Nibby, Jr. entitled, "Control Store Double Pump Operation," filed on even date herewith, bearing Ser. No. 07/286,581, which is assigned to the same assignee as this patent application.
5. The patent application of Richard P. Kelly and Robert V. Ledoux entitled, "Control Store Address Generator for Developing Unique Instruction Execution Starting Address," filed on even date herewith, bearing Ser. No. 07/286,582, which is assigned to the same assignee as this patent application.

BACKGROUND OF THE INVENTION

1. Field of Use

This invention relates to computer memories and more particularly to dual port memories.

2. Prior Art

Many processing units are required to share scratch pad memories. To avoid problems of contention in the case of simultaneous requests, it has been desirable to provide dual port read and write memories. For the most part, these memories have been constructed from separate integrated circuit chips in which access is controlled through a multiplexer circuit. This arrangement has been found to permit independent reading and writing from the input read and write ports.

Another approach has been to provide special storage cell arrangements which enable a storage location to be simultaneously read and written by employing read/write delay elements which avoid overwriting the contents of storage cells at an address which is currently selected to be read during the transition to a write at another address. While this may eliminate the use of redundant storage elements, it requires special memory cells and could also result in an increase in the overall memory cycle time. Another disadvantage of such prior art dual port read and dual port write memories is that they normally require a large number of components which take up a large area when implemented in LSI or VLSI technology. Examples of these types of arrangements are disclosed in U.S. Pat. Nos. 4,610,004 and 4,623,990.

Additionally, the prior art memories require a finite period of time in which writing is to take place. Therefore, in the case of a read modify write cycle of operation, the processing unit is required to provide the data to be stable at the memory a certain period of time before writing takes place. Since the write operation cannot take place until the modify operation is completed, the result is that additional memory cycles may be required in order to carry out the entire read modify write cycle of operation. That is, the read-modify write operation typically spans three cycles of approximately the same time duration. Therefore, when the modify operation cannot be performed within the specified time, additional cycles are required.

Therefore, it is an object of the present invention to provide a memory which has a dual port read and write capability which is implemented using standard memory cells.

It is a further object of the present invention to provide a dual read/write memory which is accessible for reading and writing from two different ports by a plurality of sources with a minimum of complexity.

SUMMARY OF THE INVENTION

The above objects are achieved according to a preferred embodiment of the dual port read/write register file memory which includes means for performing a read-modify write cycle of operation within a single CPU cycle of operation. The register file memory is constructed from one or more (RAM) addressable multibit storage locations organized to form a dual read port, single write port RAM. Additionally, the register file memory includes a plurality of clocked input registers arranged in pairs for storing command, address and data signals for two write ports. The different pairs of registers are connected as inputs to a first set of multiplexer circuits, whose outputs connect to the write control signal, address and data inputs of the single write port.

The single write port to the RAM array is enabled for writing twice during each cycle. This allows data clocked into the input registers during the previous cycle to be written sequentially into the register file storage locations. By writing data into the input registers instead of the register file memory in a previous cycle, the time required for writing is reduced to a minimum. This allows the modify portion of a read-modify write cycle to be lengthened, thereby improving the performance of units or sources utilizing the register file memory. This arrangement provides improvement in performance, particularly when used in pipelined systems, such as the system disclosed in the above related patent applications.

To reduce complexity, the writing is performed in a predetermined sequence which also facilitates testing. That is, in those cases where the sources connected to both pairs of clocked input registers specify the same write address, the same storage location will be written twice in a specified sequence which can be easily verified.

In the preferred embodiment, the pair of registers storing write data connect as inputs to a second set of multiplexer circuits. Each of the multiplexer circuits is connected to have as a further input, a different one of the register file read ports. The output of each of the second set of multiplexer circuits is connected to a different one of a plurality of output latches. The register file memory, clocked input registers, multiplexer circuits and latches are embodied on a single, integrated circuit chip.

Additionally, there are on chip comparison circuits for detecting any conflicts arising during writing. That is, if data being written from one of the clocked input data registers into a storage location, which is the same as being read from one of the read ports, the comparison circuits enable the corresponding output multiplexer circuit position for loading the data into the port output latches. This ensures that the correct data is read out from each read port at all times.

The novel features which are believed to be characteristic of the invention both as to its organization and method of operation, together with further objects and advantages, will be better understood from the following description when considered in connection with the accompanying drawings. It is to be expressly understood, however, that each of the drawings is given for the purpose of illustration only and is not intended as a definition of the limits of the present invention.

DESCRIPTION OF THE PREFERRED EMBODIMENT

Figure 1:
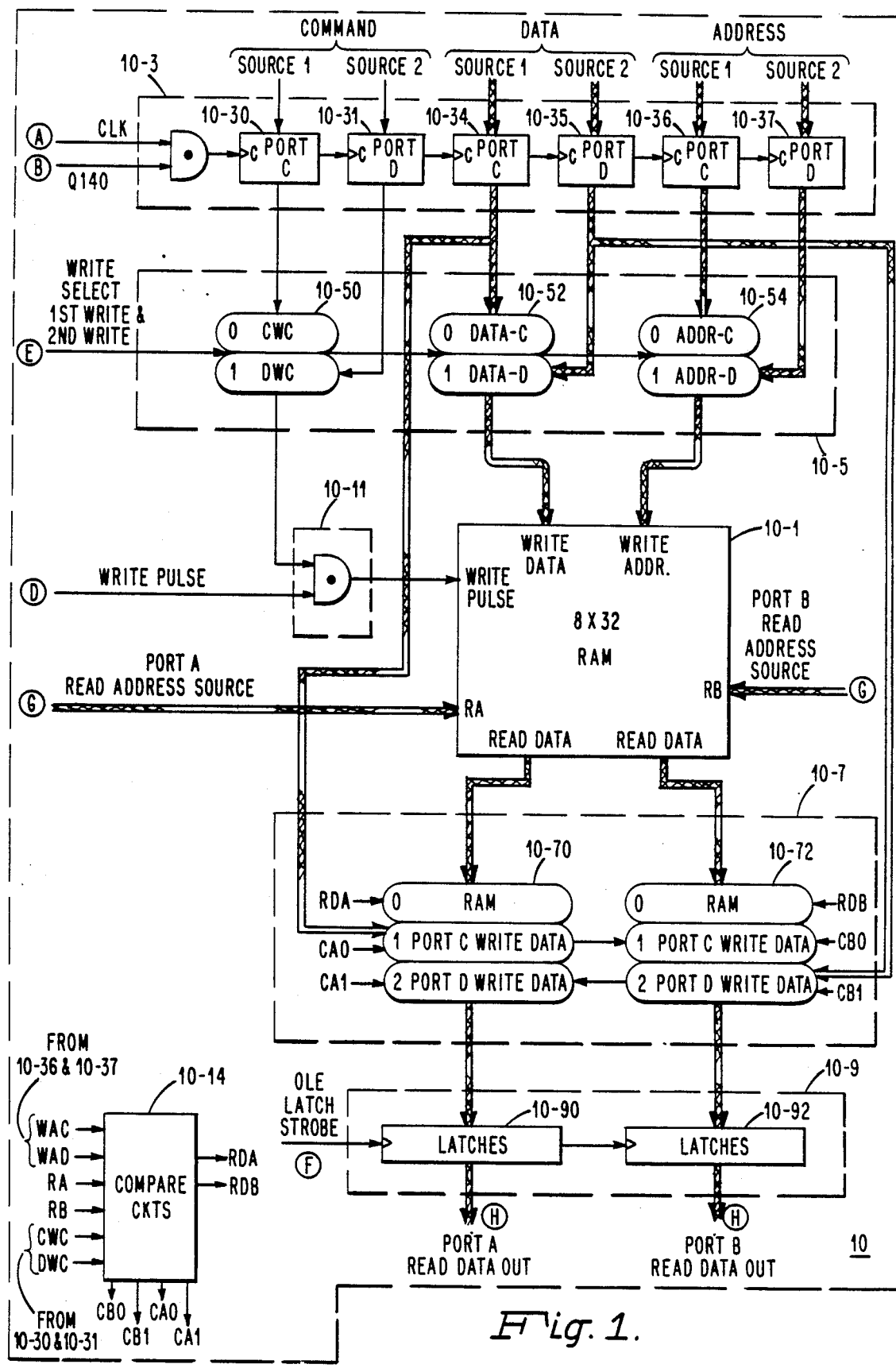
FIG. 1 shows in block diagram form, a preferred embodiment of a register file memory which incorporates the principles of the present invention.

FIG. 1 shows the basic organization of a register file memory which incorporates the teachings of the present invention. As seen from FIG. 1, the register file memory 10 includes a random access memory (RAM) part 10-1 and a rank or set of input clocked registers of block 10-3 for storing write command, address and data signals applied by a pair of sources to the write ports C and D of the register file memory 10.

The register file memory 10 further includes a set of input multiplexer circuits of block 10-5 which connect the write port registers to the write enable, write data and write address terminals of the single write port of the RAM part 10-1. Also, included is a number of output multiplexer circuits of block 10-7, each of whose inputs connect to one of the two read ports RA and RB of RAM part 10-1 and to each of the write port data registers. The output of each multiplexer circuit connects to one of the pair of output latches of block 10-9. The file memory 10 has a write control circuit block 10-11 which connects as shown to the write enable terminal labeled WRITE PULSE and to the output of the command register multiplexer circuit 10-50. The block includes an AND gate which, in response to the sequence of write pulses, applies write pulses to the WRITE PULSE terminal as a function of the output write command signals applied by multiplexer circuit 10-50.

The register file memory 10 further includes the comparison circuits of block 10-14 which are connected to compare the file memory write port C and D write address and read port RA and RB read addresses and generate control signals for selecting the source of output data to be loaded into the read port latches of block 10-9. More specifically, when there is no identical comparison, that is, the storage locations specified by the C and D port address registers 10-36 and 10-37 are not the same storage locations as are being read, then the data at the RAM part 10 read ports A and B is selected by enabling the first position 0 of the multiplexer circuits 10-70 and 10-72. However, when the storage location being written from either port C or port D is the same as the storage location being read by port A or port B, then the data being written by that port is selected by enabling either the second (1) or third (a) positions of the multiplexer circuits 10-70 and 10-72. The selection signals, generated by compare circuits 10-14 for port A, correspond to signals RDA, CA0 and CA1 and for port B, correspond to signals RDB, CB0 and CB1.

Figure 2:
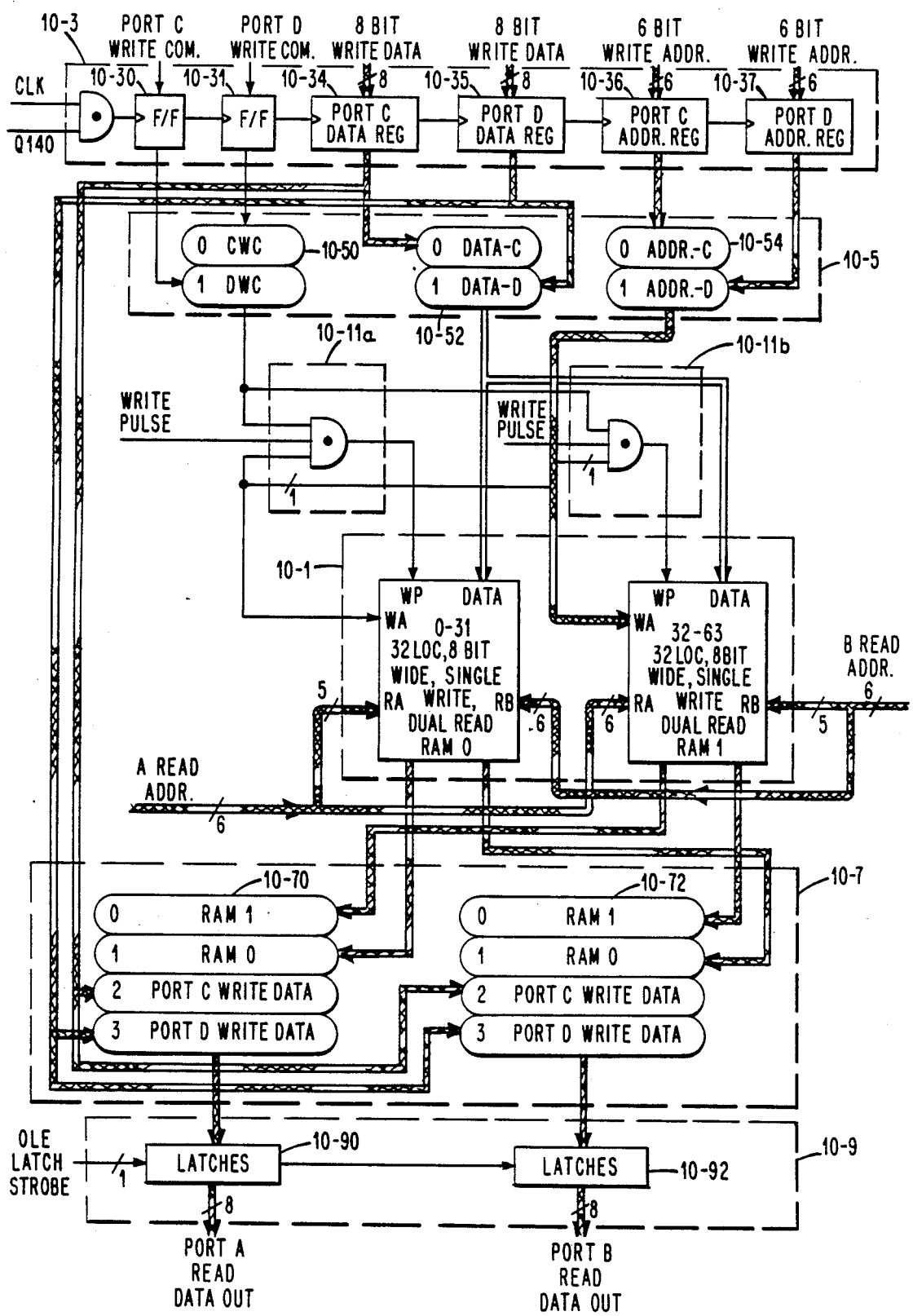
FIG. 2 is a more detailed block diagram of FIG. 1.

The RAM part 10-1 of FIG. 1 in simplified form contains 32 storage locations, each 8 bits wide. In the preferred embodiment, RAM part 10-1 contains 64 locations and is constructed from a number of $32 \times 8$ single write dual read memory parts. The parts are placed in parallel as shown in FIG. 2 to provide the desired number of locations. The desired 32-bit width would be obtained by adding three more of $32 \times 8$ bit RAM parts.

This arrangement greatly facilitates the layout and routing of signal lines when the register file memory 10 is implemented in VLSI form. Additionally, the organization makes it easy to perform byte operations on data stored in different storage locations.

The remaining components of the memory 10 are also implemented with standard parts. For example, the registers of block 10-3 can be constructed from conventional D-type flip-flops while latches of block 10-9 can be constructed from standard transparent latch circuits.

The memory 10 receives several timing signals which, for the purpose of the present invention, are generated in a conventional manner. However, for further information, reference may be made to the related patent applications. As seen from FIG. 2, the registers of block 10-3 are clocked in response to signal Q140 along with signal CLK applied by an input AND gate to the clock input terminals of each of the registers 10-30 through 10-37 as shown in FIG. 1. Each of the multiplexers 10-50 through 10-54 receive a write selection signal WRITE SELECT whose state determines which write port to select (i.e., position 0 or 1). In the preferred embodiment, the write ports C and D are always selected in the same order which is port C then port D defined by the binary ZERO and binary ONE states respectively of signal WRITE SELECT.

FIG. 2 as mentioned briefly shows in greater detail, the RAM part 10-1 of FIG. 1. The register file memory 10 is essentially the same, except for the duplication of the write control block 10-11 which now has an additional input for designating which half of the 64 storage locations is being addressed. Also, the number of positions contained within multiplexers 10-70 and 10-72 of block 10-7 has been increased by one to provide outputs from both RAM parts (i.e., RAM 0 and RAM 1). Except for these changes, both register file memories are the same.

DESCRIPTION OF OPERATION

Figure 3:
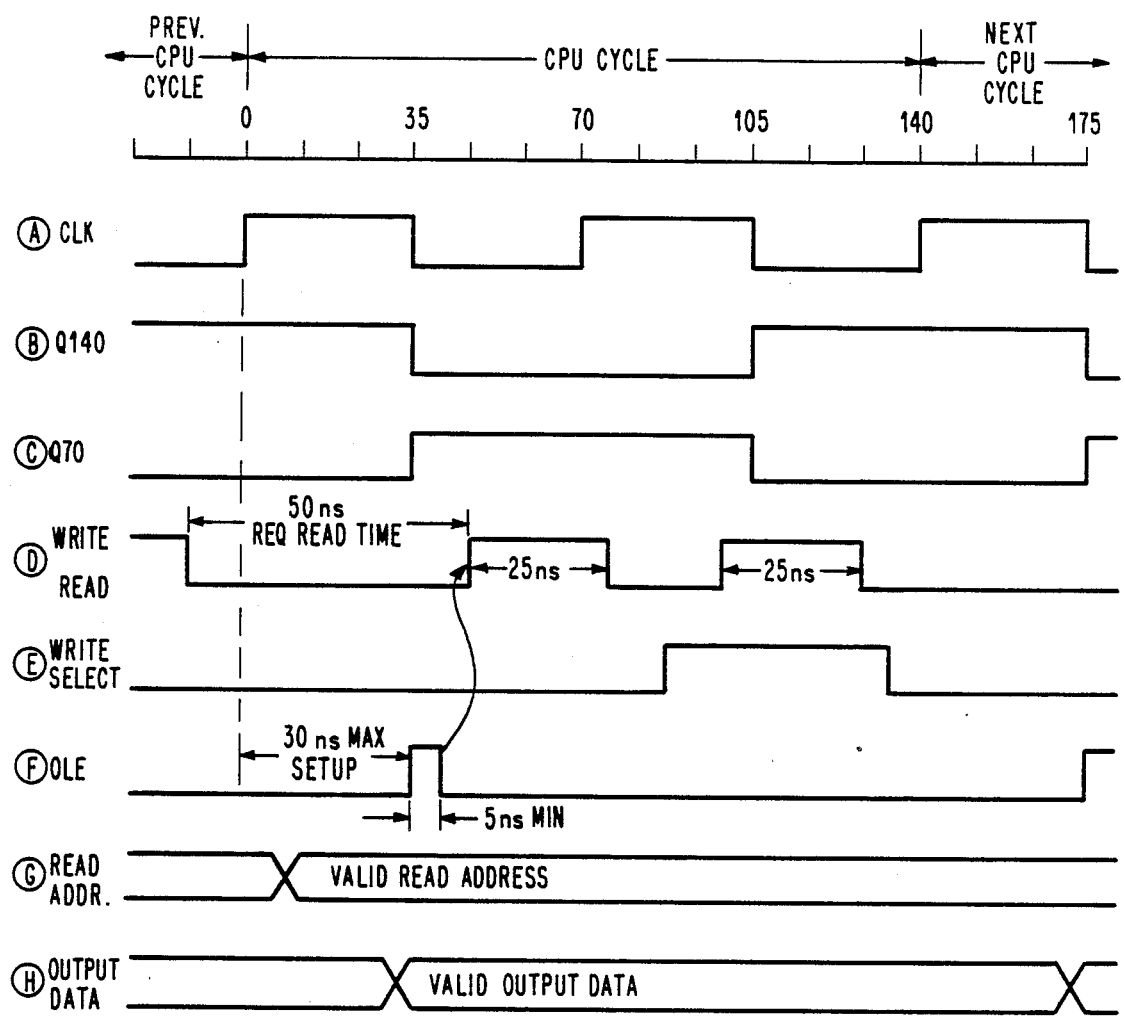
FIG. 3 shows the timing of the register file of the present invention.

With reference to the timing and flow diagrams of FIGS. 3 and 4, the operation of the preferred embodiment of the present invention of FIGS. 1 and 2 will now be described. Referring to FIG. 3, it is seen there are several machine or CPU cycles shown. Only one cycle labeled CPU cycle is shown in its entirety. As indicated, each CPU cycle includes a read portion, a modify portion and a write portion. In the prior art, these are normally three cycles of equal length.

In the present invention, each CPU cycle has a read portion, 50 nanoseconds of standard duration, an extended modify portion of approximately 88 nanoseconds, and a very short write portion of approximately 2 nanoseconds. During the read portion of the cycle, normal reading takes place. That is, the addresses are applied to read ports A and B, during the interval shown in waveform G, at which time the write select signal WRITE SELECT is a binary ZERO as indicated by waveform E. The data contents of addressed storage locations are read out and, upon being stabilized, are strobed into the latches of block 10-9 by latch strobe signal OLE as shown by waveform F. The leading edge of signal OLE coincides with the timing signal Q70 of waveform C and has a minimum duration of 5 nanoseconds. The read data is thereafter applied to the outputs of the latches and remains valid for the duration indicated in waveform H.

The extended modify portion of the CPU cycle approximates 88 nanoseconds while the write portion has a duration of just two nanoseconds which corresponds to the time required to clock the command, address and data applied by the input sources into the C and D port registers of block 10-3. This allows the modify portion of the CPU cycle from the perspective of the sources to appear quite long in that writing requires only a few nanoseconds as contrasted with the normal 30 nanoseconds which would be allocated in the case of read, modify write cycles of equal duration.

As indicated by waveform D, once the read portion of the cycle is over, two consecutive write pulses are provided during which two consecutive write operations are performed. As indicated by waveform E, during the first pulse when signal WRITE SELECT is a binary ZERO, the data from port C (position 0) is written into the specified storage location. During the second write pulse when signal WRITE SELECT is a binary ONE, the data from port D is written into the specified storage location. At the end of the CPU cycle, the data from the sources are clocked into the registers of ports C and D, in response to the leading edge of signal CLK of waveform A.

Figure 4:
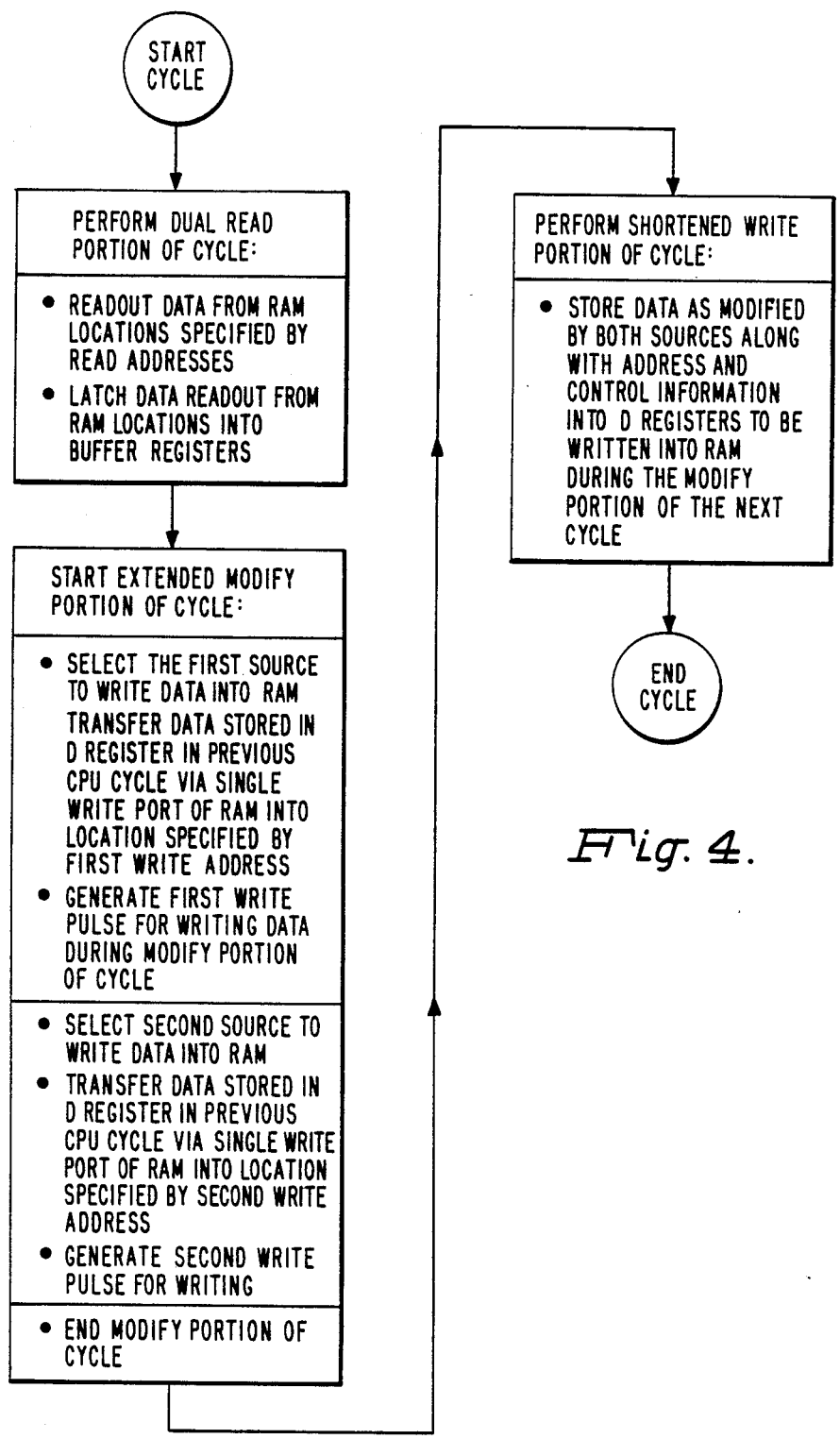
FIG. 4 is a flow diagram used in describing the operation of the present invention.

The above operations will now be summarized with specific reference to the flow chart of FIG. 4. It will be noted that prior to the start of a CPU cycle, the data representing the results generated by the sources connected to write port registers will have been already clocked into the registers of block 10-3 along with the required command and address signals. The command registers 10-30 and 10-31 each contain a single bit position which when set to a binary ONE denotes that writing is to take place. The write address registers, each contain six bit positions in which the high order or most significant bit position is used to specify which of the two byte wide RAM's (i.e., RAM 0 or RAM 1) is being addressed. That is, the content of this bit position is applied as one of the inputs to the AND gates of blocks 10-11a and 10-11b.

As seen from FIG. 4, during the read portion of the cycle, the normal dual read operation is allowed to take place. That is, data is read out from the RAM storage locations specified by the read addresses applied to the RA and RB read port address terminals. Thereafter, the data is read out from storage locations, applied via the multiplexer circuits of block 10-7 and strobed into the latch buffer registers of block 10-9 by strobe enable signal OLE. It is assumed that the compare circuits of block 10-14 have detected no conflict and have forced signal RDA to a binary ONE resulting in the selection of the O positions of multiplexer circuits 10-70 and 10-72. This completes the read portion of the cycle.

Next, as seen from FIG. 4, the extended modify portion of the cycle is started. During the first part of this portion of the cycle, the first source port C is selected to write data into RAM part 10-1 by the WRITE SELECT signal. At that time, the WRITE SELECT signal applies the data contents of C port register 10-34 to the write data input terminals of the single write ports of RAM 0 and RAM 1 of the RAM part 10-1 via multiplexer circuit 10-52. At the same time, signal WRITE SELECT also applies the write address contents of C port address register 10-36 to the write address terminals of the single write ports of RAM 0 and RAM 1 of RAM part 10-1 via multiplexer circuit 10-54. Thereafter, the data stored in the data register of port C, during the previous CPU cycle, is written into the storage location specified by the first write address in response to the first write pulse of FIG. 3 applied via the AND gate of block 10-11 which is enabled by the write command signal from C port register 10-30 applied via multiplexer circuit 10-50.

The first write operation is followed by a second write operation as indicated in FIG. 4. That is, the second source port D is selected when signal WRITE SELECT switches to a binary ONE state. This causes the data contents of D port register 10-35 to be applied to the write data input terminals of the single write ports of RAM 0 and RAM 1 of RAM part 10-1 via multiplexer circuit 10-52. Also, at that time, signal WRITE SELECT causes multiplexer circuit 10-54 to apply the write address contents of D port address register 10-37 to the write address terminals of the single write ports of RAM 0 and RAM 1 of RAM part 10-1 via multiplexer circuit 10-54.

Also, at this time, signal WRITE SELECT causes multiplexer circuit 10-50 to apply as an output, the contents of the D port command register 10-31 as an input to the AND gate of block 10-11. In response to the second write pulse of FIG. 3, the data stored in the port D data register during the previous CPU cycle is written into the specified second write address of RAM part 10-1. As seen from FIG. 4, this completes the modify portion of the cycle.

Next, the write portion of the CPU cycle is performed. During this portion of the cycle, the timing signals Q140 and CLK cause the data, address and command signals applied to the C and D port registers of block 10-3 to be loaded into the corresponding registers. This information is written into the RAM part 10-1 during the modify cycle of the next CPU cycle of FIG. 4. This completes the CPU cycle of operation.

The operation of the comparison circuits of block 10-14 will now be considered in greater detail. If, during the read portion of the CPU cycle, the comparison circuits of block 10-14 detect a conflict, the circuits operate to apply the appropriate signals to the multiplexer circuits of block 10-7 which cause the correct data to be stored in the latches of block 10-9. That is, if, for example, the source connected to read port A specifies a read address which is the same as the write address stored in port C address register 10-36, the compare circuits of block 10-14 operate to force signal CA0 to a binary ONE. This causes the multiplexer circuit 10-70 to apply the data contents of the C port data register 10-34 as an input to the latches 10-90 ensuring that the requesting source receives the most recent data which is to be written into that storage location during the same CPU cycle. In a similar fashion, the compare circuits of block 10-14 also select the data contents of the D port data register 10-35 by forcing signal CA1 to a binary ONE upon detecting the same type of conflict. The operation of the compare circuits is the same for address conflicts detected which involve read port B.

From the above, it is seen how the register file memory of the present invention provides a dual port read dual port write memory capability without the attendant complexities. By constructing the register file memory from standard dual read single write port memory parts, considerable savings in space, complexity and cost are achieved. Additionally, the sequential write operations of each CPU cycle are carried out in the same predetermined sequence simplifying the design while also facilitating testing. In the preferred embodiment, no restrictions are placed on writing to the same storage location from both ports as is required in certain prior art, dual port read, dual port write memories. This can provide a quick way of verifying the operation of the register file memory.

Many modifications may be made to the preferred embodiment of the present invention without departing from its teachings. For example, the present invention may be implemented from any standard dual port read single port write memory parts. Also, any number of parallel connected byte wide memory parts may be utilized to provide a desired word size with independent byte addressing.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A dual port read/write memory having a single write input sort comprising:
   a random access memory (RAM) array having a plurality of addressable storage locations, said RAM having said single write port including a set of write data, address and write enable input terminals;
   clocked input register means for storing sets of write data, address and command information associated with a pair of ports;
   multiplexer selector means connected to said register means for receiving said sets of information and said multiplexer selector means being connected to apply said sets of information to corresponding ones of said write data, address and write enable terminals of said RAM; and,
   input means for applying a sequence of timing signals to said memory during each cycle of operation including a bistate write select signal applied to said multiplexer selector means and first and second sequential write pulse signals applied to said RAM write enable input terminal, said RAM being enabled by said first write pulse signal to write said data of one of said ports into one of said plurality of locations specified by said address associated therewith in response to said command information applied by said selector means when said write select signal is in a first state and said RAM being enabled by said second write pulse signal to write said data of another one of said ports into another one of said locations specified by said address associated therewith in response to said command information when said write select signal is in a second state so as to provide a dual port write capability for said each cycle of operation.

2. The memory of claim 1 wherein each cycle of operation includes a read portion, an extended modify portion and a shortened write portion, said first and second sequential write pulse signals occurring during said extended modify portion of said each cycle of operation.

3. The memory of claim 2 wherein said input means includes AND gating means having at least a pair of input terminals and an output terminal, one of said pair of input terminals being connected to said multiplexer selector means for receiving said set of command information from said register means, another one of said pair of input terminals being connected to receive said first and second write pulse signals and said output terminal being connected to said write pulse input terminal, said AND gating means successively applying said first and second write pulse signals as a function of said set of command information sequentially applied by said multiplexer selector means in response to said write select signal during said each cycle of operation.

4. The memory of claim 2 wherein said memory further includes:
   at least a pair of read ports connected to said RAM for accessing data from said storage locations in response to read addresses applied to said read ports;
   transparent latch means for temporarily storing said data read out from said RAM locations;
   data output multiplexer selector means connected to said transparent latch means, to said RAM for receiving data read out by said read ports and to said register means for receiving said sets of write data information; and,
   comparison means having a plurality of sets of inputs connected to said register means for receiving said sets of write address and command information and connected to said pair of read ports for receiving said read addresses, and said comparison means having a set of outputs connected to said output data multiplexer selector means, said comparison means upon detecting an identical comparison between any one of said read addresses and said write addresses generating signals on said set of outputs for causing said data multiplexer selector means to transfer said write data to said transparent latch means in lieu of said data read out from said RAM for ensuring that the most recent output data is provided by said memory in response to each read port access.

5. The memory of claim 4 wherein said comparison means generates an output signal for each said identical comparison detected between said read and write addresses as follows:
   when $CWA = RA$ and $CWC = 1$; or
   $DWA = RA$ and $DWC = 1$; or
   $CWB = RB$ and $CWC = 1$; or
   $DWB = RB$ and $DWC = 1$
in which CWA, DWA and CWC, DWC respectively correspond to said write address and command information stored in said register means and RA and RB correspond to said read addresses applied to said read ports.

6. The memory of claim 2 wherein said addresses applied by said selector means when said write select signal is in said first and second states are coded without any restriction to specify the same location for enabling different data to be written into said same location during said each cycle of operation to facilitate memory testing.

7. The memory of claim 2 wherein said write select signal during said each cycle of operation repeats a same sequence of states causing said multiplexer selector means to select said sets of write data, address and command information always in the same order.

8. The memory of claim 2 wherein said sequence of timing signals includes a clock signal occurring during said shortened write portion of said each cycle of operation, said input means applying said clock signal to said register means for storing said sets of write data, address and command information to be written into said memory during a next cycle of operation.

9. The memory of claim 2 wherein said array includes a plurality of byte wide memory modules, each module having a predetermined number of storage locations, said modules being arranged in parallel to provide a desired number of locations with a desired bit width.

10. The memory of claim 2 wherein said memory further includes:
    a pair of read ports connected to said RAM for accessing data from said storage locations in response to read addresses applied to said read ports;
    transparent latch means for temporarily storing said data read out from said RAM locations;
    data output means connected to said transparent latch means and to said RAM; and
    wherein said sequence of timing signals further includes an output latch enable pulse signal, said input means including means for applying said output latch enable pulse signal to said transparent latch means during said read portion of said each cycle of operation for temporarily storing said data received from said data output means read out by said read ports.

11. A dual port read/write register file memory having a single write input port comprising:
    a random access memory (RAM) array having a plurality of addressable storage locations, said RAM having said single write input port including a number of write data and address input terminals and a write pulse control terminal;
    a plurality of clocked input registers, different pairs of said plurality of registers for receiving and storing write data, address and command information associated with a pair of sources;
    a plurality of multiplexer circuits, each circuit having sets of input terminals, a control input terminal and a number of output terminals, said sets of input terminals of a different one of said multiplexer circuits being connected to receive said data, address and command information from said pair of sources, said output terminals of corresponding ones of said different multiplexer circuits being connected to said number of write data, address and write pulse control terminals of said RAM and said control input terminal of each multiplexer circuit being connected to receive a bistate write select signal; and,
    input means for applying a sequence of timing signals during each cycle of operation including said bistate write select signal applied to said control input terminal of each multiplexer circuit and first and second sequential write pulse signals applied to said write pulse control terminal, said first write pulse signal enabling said RAM to write said data stored in one of said clocked input registers associated with one of said pair of sources into one of said plurality of locations specified by said address associated therewith transferred to said outputs of said multiplexer circuits as a function of said command information specified when said write select signal is in a first state and said second write pulse signal enabling said RAM to write data stored in another one of said clocked input registers associated with another one of said pair of sources into one of said locations specified by said address associated therewith transferred to said outputs of said multiplexer circuits as a function of said command information specified when said write select signal is in a second state thereby providing a dual write capability for each cycle of operation.

12. The memory of claim 11 wherein each cycle of operation includes a read portion, an extended modify portion and a shortened write portion, said first and second sequential write pulse signals occurring during said extended modify portion of said each cycle of operation.

13. The memory of claim 12 wherein said input means includes AND gating means having at least a pair of input terminals and an output terminal, one of said pair of input terminals being connected to one of said plurality of multiplexer circuits for receiving said command information from said clock input registers associated with said pair of sources, another one of said pair of input terminals being connected to receive said first and second sequential write pulse signals and said output terminal being connected to said write pulse terminal, said AND gating means successively applying said write pulse signals as a function of said command information sequentially transferred by said one different one of said multiplexer circuits from one of said different pairs of said clocked input registers during said cycle of operation.

14. The memory of claim 12 wherein said write select signal during said each cycle of operation repeats a same sequence of states causing said plurality of multiplexer circuits to select said sets of write data, address and command information always in the same order.

15. The memory of claim 12 wherein said sequence of timing signals includes a clock signal occurring during said shortened write portion of said each cycle of operation, said input means applying said clock signal to said registers for storing said sets of write data, address and command information received from each source to be written into said memory during a next cycle of operation.

16. The memory of claim 12 wherein said array includes a plurality of byte wide memory modules, each module having a predetermined number of storage locations, said modules being arranged in parallel to provide a desired number of locations with a desired bit width.

17. The memory of claim 12 wherein said memory further includes:
    a pair of read ports connected to said RAM for accessing data from said storage locations in response to read addresses applied to said read ports;

a plurality of transparent latches for temporarily storing said data read out from said RAM locations of each read port;

data output circuit means connected to said transparent latches and to said RAM; and wherein said sequence of timing signals further includes an output latch enable pulse signal, said input means including means for applying said output latch enable pulse signal to said plurality of transparent latches during said read portion of said each cycle of operation for temporarily storing said data received from said data output means read out by said read ports.

18. The memory of claim 11 wherein said memory further includes:

at least a pair of read ports connected to said RAM for accessing data from said storage locations in response to read addresses applied to said read ports;

a plurality of transparent latches for temporarily storing said data read out from said RAM locations of each read port;

a plurality of data output multiplexer circuits connected to said transparent latches, to said RAM read ports for receiving data read out from said RAM and to said registers for receiving said sets of write data information; and a set of comparison circuits, each having a plurality of sets of inputs connected to said register means for receiving said sets of write address and command information and connected to one of said pair of read ports for receiving read addresses, and each said comparison circuit having a set of outputs connected to one of said plurality of output data multiplexer circuits, said each comparison circuit upon detecting an identical comparison between any one of said read addresses and said write addresses generating signals on said set of outputs for causing said data multiplexer circuit to transfer said write data to said transparent latches in lieu of said data read out from said RAM for ensuring that the most recent output data is provided by said memory in response to each read port access.

19. The memory of claim 18 wherein one of said set of comparison circuits generates an output signal for each said identical comparison detected between said read and write addresses as follows:

when CWA=RA and CWC=1; or
DWA=RA and DWC=1; or
CWB=RB and CWC=1; or
DWB=RB and DWC=1 in which CWA, DWA and CWC, DWC respectively correspond to said write address and command information stored in said registers and RA and RB correspond to said read addresses applied to said read ports.

20. The memory of claim 11 wherein said addresses applied by a corresponding one of said multiplexer circuits when said write select signal is in said first and second states are coded without any restriction to specify the same location for enabling different data to be written into said same location during said each cycle of operation to facilitate testing.

21. A method of constructing a digital memory device integrated on a single integrated circuit chip with standard dual read, single write port random access memory (RAM) parts for enabling a dual write port operation, said method comprising the steps of:

mounting a number of said RAM parts on said chip in parallel to provide a desired number of storage locations and a desired bit width, each RAM having a plurality of addressable storage locations and said single write port including a number of write data, address and write pulse control terminals;

connecting a number of on chip clocked input registers, different pairs of said registers for receiving sets of write data, address and command information associated with a pair of sources;

connecting a plurality of on chip multiplexer circuits between said different pairs of input registers and said RAM parts, a different multiplexer circuit for applying said sets of write data, write address and write command information from said input registers to said single write port data, address and write pulse control terminals;

connecting on chip transparent latch circuits to said dual read ports for receiving data read out from said RAM parts;

connecting on chip input means for applying a sequence of timing signals to said chip during each cycle of operation, said sequence of timing signals including an output latch strobe signal, a bistate write select signal, first and second sequential write pulse signals and an end of cycle clocking signal;

applying said output latch strobe signal to said transparent latch circuits for storing said data read out from said RAM parts;

applying said write select signal to said multiplexer circuits for transferring sequentially, said set of command information associated with said pair of sources as a function of the state of said bistate write select signal;

applying said first and second sequential write pulse signals to said write pulse control terminal of each RAM part in response to said set of command information for enabling said RAM parts to be written twice during said cycle of operation with write data into locations specified by said set of write address information; and, applying said end of cycle clocking signal to said number of input registers for storing sets of write data, address and command information to be written into said RAM parts during a next cycle of operation.

22. The method of claim 21 wherein during said each cycle of operation, each of said RAM parts first performs a read operation for transferring data to said transparent latch circuits having a normal time duration, followed by performing a modify operation in which each of said RAM parts are written twice having an extended time duration and performing a write operation to said clocked input registers having a shortened time duration.

* * * * *

UNITED STATES PATENT AND TRADEMARK OFFICE
CERTIFICATE OF CORRECTION

PATENT NO. : 4,933,909
DATED : June 12, 1990
INVENTOR(S) : David E. Cushing, et al.

It is certified that error appears in the above-identified patent and that said Letters Patent is hereby corrected as shown below:

On the title page and in column 1:
Please correct the title to read "Dual Port Read/Write Register File Memory" in lieu of --Dual Read/Write Register File Memory--.

Signed and Sealed this

Twenty-sixth Day of November, 1991

Attest:

HARRY F. MANBECK, JR.

*Attesting Officer*     *Commissioner of Patents and Trademarks*